United States Patent

[11] 3,626,329

[72] Inventor Glenn Edward Larson
Old Bridge, N.J.
[21] Appl. No. 40,937
[22] Filed May 27, 1970
[45] Patented Dec. 7, 1971
[73] Assignee Bell Telephone Laboratories, Incorporated
Murray Hill, Berkeley Heights, N.J.

[54] CRYSTAL-CONTROLLED MULTIVIBRATOR OSCILLATOR
10 Claims, 1 Drawing Fig.

[52] U.S. Cl. .......... 331/113 R, 331/116 R, 331/159
[51] Int. Cl. .......... H03b 5/36, H03k 3/282
[50] Field of Search .......... 331/113 R, 116 R, 144, 159

[56] References Cited

UNITED STATES PATENTS 3,375,466 3/1968 Pratt .......... 331/116
3,217,269 11/1965 Rowley et al. .......... 331/113

FOREIGN PATENTS 257,698 3/1963 Australia .......... 331/116

*Primary Examiner*—John Kominski
*Assistant Examiner*—Siegfried H. Grimm
*Attorneys*—R. J. Guenther and Kenneth B. Hamlin

ABSTRACT: The frequency of a square wave transistor multivibrator oscillator is determined by a high-gain AC coupled quartz crystal feedback loop. Oscillator startup is provided by a DC coupled RC network feedback path which provides only sufficient gain to barely sustain oscillations. When power is turned on, the first-stage transistor is slowly biased through its linear region. The RC network thus provides a sinusoidal wave until energy at the resonant frequency of the crystal is produced, whereupon the crystal feedback path, which dominates, "takes over" and the multivibrator frequency becomes solely dependent upon the crystal.

PATENTED DEC 7 1971 3,626,329
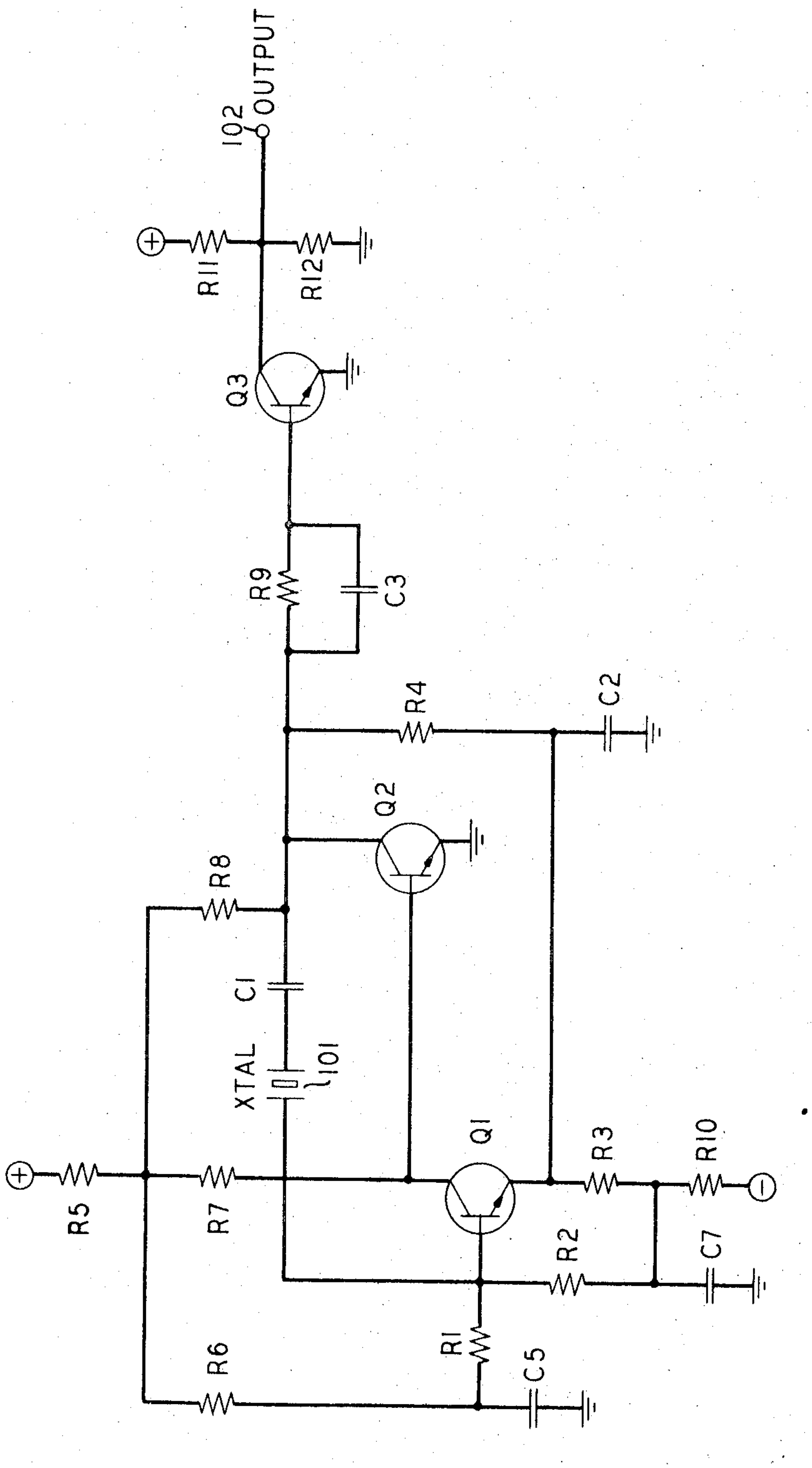
INVENTOR
G. E. LARSON
BY R C Lipton
ATTORNEY

CRYSTAL-CONTROLLED MULTIVIBRATOR OSCILLATOR

FIELD OF THE INVENTION

This invention relates to crystal-controlled square-wave multivibrator oscillators and, more particularly, to starter circuits that enable saturating-type astable multivibrators to initiate oscillations when the power supply is turned on.

DESCRIPTION OF THE PRIOR ART

The rectangular wave output of multivibrator oscillators, when utilized for clock timing and synchronizing, must feature a high degree of frequency stabilization and short rise and fall times. A saturating type astable multivibrator having high loop gain feedback through an AC coupled quartz crystal meets these requirements.

A problem of the saturating-type astable multivibrator is "-hard starting" or lockup. Lockup occurs when power is turned on and one or both active elements of the multivibrator go into saturation. This reduces loop gain to less than unity and ties one side of the feedback path to the low impedance provided by the saturated active element, thus preventing noise from initiating oscillation. It is known to overcome lockup by providing a starter circuit which shocks the multivibrator, providing noise to initiate oscillations. The starter circuit, however, must thereafter be disconnected from the multivibrator to insure that it does not inject unwanted signals into the oscillator.

It is an object of this invention to provide an improved starter circuit. More specifically, it is a further object of this invention to provide a starter circuit which does not require to be disconnected from the oscillator after startup.

SUMMARY OF THE INVENTION

In the present invention, the starter circuit network, although coupled to the multivibrator, is arranged to have no effect on the oscillator frequency. In accordance therewith, the feedback for the oscillator follows two paths: An AC coupled quartz crystal path wherein the resonant frequency of the crystal corresponds to the frequency of the oscillator and a second independent frequency-determining path which provides startup but which is limited to providing substantially less gain than the crystal path. The operation of the oscillator is initiated by the second path until energy at the resonant frequency of the crystal is produced, whereupon the crystal feedback path, which dominates, "takes over" and the multivibrator frequency becomes solely dependent upon the crystal.

It is a feature of this invention that the second independent frequency-determining path comprises a DC coupled RC network path which provides only sufficient gain to barely sustain the multivibrator oscillating.

In accordance with a specific embodiment, the multivibrator comprises a transistor pair. The output of the first transistor is coupled to the input of the second by way of a direct DC connection which passes all frequencies substantially impedance free. The output of the second transistor is fed back through two paths including an AC coupled crystal path which, in combination with the first and second transistors, provides sufficient gain to drive the first transistor into saturation and a DC coupled RC network which, in combination with the first and second transistors, provides only sufficient gain to barely sustain the multivibrator oscillating.

It is a further feature of this invention that initially the first transistor is slowly biased through its linear region whereby a nearly sinusoidal waveform is produced with the RC network.

The foregoing and other objects and features of this invention will be more fully understood from the following description of an illustrative embodiment thereof taken in conjunction with the accompanying drawing.

BRIEF DESCRIPTION OF THE DRAWING

The accompanying drawing shows, in schematic form, an improved starter circuit for a saturating-type crystal controlled multivibrator in accordance with this invention.

DETAILED DESCRIPTION

The master clock circuit shown in the drawing can be divided into two sections. Transistors Q1 and Q2 form the multivibrator oscillator section while transistor Q3 serves the dual purpose of waveform squarer and buffer.

The coupling from the collector of transistor Q1 to the base of transistor Q2 is provided over a substantially impedance free DC path. Feedback from the collector of transistor Q2 to the base of transistor Q1 takes place through capacitor C1 and crystal 101. The crystal acts as a high Q band-pass filter offering its lowest series resistance at its fundamental resonant frequency. In a specific embodiment, a 1 MHz crystal is used.

With respect to the feedback from the collector of transistor Q1 to its base, transistor Q2 provides a 180° phase shift and greater-than-unity gain. At the same time, the DC coupling from the collector of transistor Q1 to the base of transistor Q2 passes all frequencies. It is seen that there is no series resistor in the crystal feedback path from the collector of transistor Q2 to the base of transistor Q1, thereby eliminating a damping effect that such resistors would have on the Q of crystal 101. Thus, the basic criteria for stable oscillation are met.

The biasing for transistor Q1 is provided by a voltage divider comprising resistors R5, R6, R1, R2, and R10, which voltage divider is connected between positive and negative voltage sources. The base of transistor Q1 is connected to the junction of resistors R1 and R2. At the same time the emitter is connected to the junction of resistors R2 and R10 by way of resistor R3, while the collector of transistor Q1 is connected to the junction of resistors R5 and R6 by way of resistor R7. The base emitter junction of transistor Q1 is thereby forward biased. This will enable transistor Q1 to initially turn ON when power is applied.

The amplitude of the current through crystal 101 is limited by connecting the collector of transistor Q2 to the junction of resistors R5 and R7 by way of resistor R8. When transistor Q2 is turned OFF and transistor Q1 is concurrently turned ON, the maximum amplitude at the collector of transistor Q2 is limited to the potential at the junction of resistors R5 and R7. This latter potential is determined by the current through resistor R5 which is applied to the collector of transistor Q1.

It can therefore be seen that high loop gain feedback and forward biasing for the transistors is provided whereby each transistor is alternately driven into saturation and a one MHz square-wave output is provided at the collector of transistor Q2.

Insofar as the feedback path of crystal 101 must necessarily be AC coupled, the multivibrator has an inherent tendency toward initial lockup, i.e., the tendency of transistor Q1 to go into saturation when power is turned ON preventing noise from initiating oscillation. The present invention eliminates the disadvantages of lockup or hard-starting by utilizing an additional feedback path. This path is a direct coupling from the collector of transistor Q2 to the emitter of transistor Q1 by way of resistor R4. Capacitor C2 is connected to the junction of resistor R4 and emitter of transistor Q1 and its component value, together with the value of resistor R4, are chosen to provide just enough feedback to initiate oscillation and thereafter maintain a nearly sinusoidal waveform at about 5 MHz. The amount of feedback via the DC path is held to a minimum value which is relatively small when compared to the feedback through crystal 101. Assume now that power is initially applied to the circuit. The supply voltages are accordingly applied across the voltage divider comprising resistors R5, R6, R1, R2, and R10. Capacitor C5, which is connected to the junction of resistors R6 and R1, and capacitor C7, which is connected to the junction of resistors R2 and R10, thereupon begin to charge. The component value of capacitor C5 is greater than the component value of capacitor C7. Accordingly, capacitor C5 charges more slowly than capacitor C7.

As capacitor C7 begins to charge, the negative potential developed on its upper plate, as shown in the drawing, is applied through resistor R3 to the emitter of transistor Q1. At the same time, the positive charge on the upper plate of capacitor C5 is applied through resistor R1 to the base of transistor Q1. Since capacitor C5 is charging more slowly than capacitor C7, transistor Q1 is slowly forward biased through its linear region.

When transistor Q1 is forward biased, and thereupon turns ON, its collector voltage drops. This tends to turn transistor Q2 OFF. The collector voltage of transistor Q2 thereupon rises, due to the positive potential applied thereto from the resistors R5 and R8. This positive collector voltage is applied through resistor R4 and tends to raise the emitter voltage of transistor Q1. This positive voltage change is opposed by capacitor C2.

The voltage on the base of transistor Q1 continues to rise. Transistor Q1 turns further ON and transistor Q2 is further turned OFF and increased positive collector voltage is applied to resistor R4. This process continues until the voltage across capacitor C2 starts to rise at a rate determined by the value of capacitor C2 and resistor R4. The rising voltage across capacitor C2 is applied to the emitter of transistor Q1 and, thus, acts as degenerative feedback. This degenerative feedback tends to turn transistor Q1 OFF and thus raises its collector voltage. The raised collector voltage, in turn, tends to turn ON transistor Q2 which, in turn, lowers its collector voltage and therefore lowers the voltage applied to resistor R4. This change is opposed by capacitor C2. The voltage on the upper plate on capacitor C2 thereafter decreases, however, and the lowered voltage tends to turn transistor Q1 ON again, whereby the whole process repeats itself. The frequency of this oscillation in the absence of the crystal feedback path is, roughly, a function of the values of resistor R4 and capacitor C2 and, as noted above, the values are chosen to produce a nearly sinusoidal waveform at 5 MHz at the collector of transistor Q2. Since the feedback paths that are operative at the time provide DC coupling, the multivibrator cannot lockup because either transistor tending to go into saturation produces an effect on the other transistor that counteracts that saturation.

If the crystal feedback path were not present, the DC coupled feedback path would continue to produce a sinusoidal waveform indefinitely. When the multivibrator operation is initiated, however, there occurs a transition from a steady DC state to sinusoidal operation at 5 MHz, creating an energy distribution at all frequencies. This broad frequency spectrum of energy is impressed on crystal 101 in the crystal feedback path, which crystal offers very low resistance to the 1 MHz. component. Since the crystal feedback path has been designed to provide a large amount of feedback, the 1 MHz energy passing through the crystal path overrides the 5 MHz energy returning through the DC coupled RC feedback path. The feedback factor is so large compared to that of the DC coupled RC path that transistors Q1 and Q2 are driven into their nonlinear regions. This virtually eliminates the RC feedback path as a factor and the multivibrator thereupon oscillates at 1 MHz producing a square wave at the collector of transistor Q2.

The square-wave output at the collector of transistor Q2 is passed through resistor R9 and capacitor C3 to the base of transistor Q3. Transistor Q3 is thereupon alternately turned ON and OFF. Its collector voltage alternately goes to ground and to a positive potential as determined by the voltage divider comprising resistors R11 and R12. This collector voltage is passed through output terminal 102. The result is an output rectangular waveform from a positive potential to ground.

Although a specific embodiment of this invention has been shown and described, it will be understood that various modifications may be made without departing from the spirit of this invention.

I claim:

1. In an oscillator circuit, a first feedback path providing greater-than-unity gain for a selected frequency and means for starting the oscillator from an initial idle condition, said starting means including a second feedback path having a frequency-determining network, the second feedback path having at all times substantially less gain at the frequency determined by the frequency-determining network than the first feedback path has at the selected frequency whereby, from an initial idle condition, the oscillator frequency is first determined by the second feedback path until energy is created at the selected frequency, whereupon the oscillator frequency is thereafter determined by the first feedback path.

2. In an oscillator circuit, in accordance with claim 1, wherein the first feedback path comprises an AC coupling path and includes therein a crystal.

3. In an oscillator circuit, a first feedback path providing greater-than-unity gain for a selected frequency, said first feedback path comprising an AC coupling path and including therein a crystal, and providing sufficient gain to drive the oscillator circuit to saturation and thereby generate a square wave, and means for starting the oscillator from an initial idle condition, said starting means including a second feedback path having a frequency-determining network, the second feedback path having at all times substantially less gain at the frequency determined by the frequency-determining network than the first feedback path has at the selected frequency whereby, from an initial idle condition, the oscillator frequency is first determined by the second feedback path until energy is created at the selected frequency, whereupon the oscillator frequency is thereafter determined by the first feedback path.

4. In an oscillator circuit, in accordance with claim 3, wherein the second feedback path comprises a DC coupling path including an RC network and provides sufficient gain to barely sustain the oscillator circuit oscillating.

5. A square-wave multivibrator oscillator comprising a first and second transistor, means for forward biasing the first and second transistors, and a plurality of concurrently enabled cross-coupling paths including an AC coupled feedback path for passing the output of the second transistor to the input of the first transistor and for offering a low impedance to a selected frequency to provide, in combination with the first and second transistors, sufficient gain to drive the first transistor into saturation and a DC coupled feedback path interconnecting the output of the second transistor and the input of the first transistor and including a frequency-determining network which, in combination with the first and second transistors, provides only sufficient gain to barely sustain the multivibrator oscillating.

6. A square-wave multivibrator oscillator in accordance with claim 5 wherein the forward-biasing means includes means enabled upon the initial application of power to slowly bias the first transistor through its linear region.

7. A square-wave multivibrator oscillator in accordance with claim 5 wherein the AC coupled feedback path includes a crystal.

8. A square-wave multivibrator oscillator in accordance with claim 7 wherein the DC coupled feedback path includes an RC network.

9. A square-wave multivibrator oscillator in accordance with claim 5 wherein the AC coupled feedback path interconnects the collector of the second transistor and the base of the first transistor and the DC coupled feedback path interconnects the collector of the second transistor and the emitter of the first transistor.

10. A square-wave multivibrator oscillator in accordance with claim 9 and including a further cross-coupling path comprising a substantially impedance-free DC path from the collector of the first transistor to the base of the second transistor.

* * * * *